US011353626B2

(12) United States Patent
You et al.

(10) Patent No.: US 11,353,626 B2
(45) Date of Patent: Jun. 7, 2022

(54) META ILLUMINATOR

(71) Applicant: SAMSUNG ELECTRONICS CO., LTD., Suwon-si (KR)

(72) Inventors: Jangwoo You, Seoul (KR); Namseop Kwon, Suwon-si (KR); Byunghoon Na, Suwon-si (KR); Minkyung Lee, Suwon-si (KR); Seunghoon Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 169 days.

(21) Appl. No.: 16/199,759

(22) Filed: Nov. 26, 2018

(65) Prior Publication Data

US 2019/0243155 A1 Aug. 8, 2019

Related U.S. Application Data

(60) Provisional application No. 62/626,263, filed on Feb. 5, 2018.

(30) Foreign Application Priority Data

Jul. 4, 2018 (KR) .................. 10-2018-0077895

(51) Int. Cl.
*G02B 1/00* (2006.01)
*G02B 27/42* (2006.01)
*H01S 5/00* (2006.01)

(52) U.S. Cl.
CPC ......... *G02B 1/002* (2013.01); *G02B 27/4233* (2013.01); *G02B 27/4272* (2013.01); *G02B 2207/101* (2013.01); *H01S 5/005* (2013.01)

(58) Field of Classification Search
CPC ............ G02B 27/4272; G02B 27/4233; G02B 2207/101; G02B 5/1876; G02B 5/1809; G02B 1/002; G02B 5/1814; G02B 5/1819; G02B 27/60
See application file for complete search history.

(56) References Cited

U.S. PATENT DOCUMENTS

| 6,370,335 | B1* | 4/2002 | Niblett ................ G01C 11/06 396/182 |
| 8,494,252 | B2 | 7/2013 | Freedman et al. |
| 9,482,796 | B2 | 11/2016 | Arbabi et al. |
| 2003/0076589 | A1* | 4/2003 | Suleski ............... G02B 5/1857 359/558 |
| 2011/0096182 | A1 | 4/2011 | Cohen et al. |
| 2011/0164032 | A1 | 7/2011 | Shadmi |
| 2016/0316180 | A1 | 11/2016 | Han et al. |

(Continued)

*Primary Examiner* — Kimberly N. Kakalec
(74) *Attorney, Agent, or Firm* — Sughrue Mion, PLLC

(57) ABSTRACT

Provided are meta illuminators. The meta illuminators according to embodiments include a first light emitter configured to emit pattern light, and a second light emitter configured to emit non-patterned light, wherein the first and second light emitters forms a single body. The first and second light emitters respectively include meta-surfaces that are different from each other, and the different meta-surfaces may be formed on a single material layer. The first light emitter includes a pattern region that transmits a portion of incident light, and the second light emitter does not include the pattern region. A mask may be arranged between the light source and the transparent substrate.

19 Claims, 11 Drawing Sheets

(56) References Cited

U.S. PATENT DOCUMENTS

2017/0116462 A1* 4/2017 Ogasawara ............ G06K 9/209
2017/0287151 A1 10/2017 Han et al.
2019/0049235 A1 2/2019 Han et al.
2019/0064532 A1* 2/2019 Riley, Jr ............ G02B 27/0916

* cited by examiner

META ILLUMINATOR

CROSS-REFERENCE TO RELATED APPLICATIONS

This application claims the benefit of U.S. Provisional Application No. 62/626,263, filed on Feb. 5, 2018, in the US Patent Office and claims priority from Korean Patent Application No. 10-2018-0077895, filed on Jul. 4, 2018, in the Korean Intellectual Property Office, the disclosures of which are incorporated herein by reference in their entireties.

BACKGROUND

1. Field

Apparatuses and methods consistent with exemplary embodiments relate to illuminators, and more particularly, to composite illuminators (hereinafter, meta illuminators) using a meta-surface based on a laser diode.

2. Description of the Related Art

Illuminations may be used in a various applications besides the use of lighting a dark place. The use of illumination may be different according to a band of light. Light in an infrared band may be used in an optical sensor like a proximity sensor in a portable device, such as a mobile phone, and also, may be used as a two-dimensional (2D) illumination and a three-dimensional (3D) illumination for face recognition. The illumination may include non-coherent light or coherence light, and the light may be generated from a specific light source or an illumination device. Accordingly, an electronic device that uses light may include various illumination devices to obtain a desired illumination.

SUMMARY

One or more exemplary embodiments provide meta illuminators having a reduced area in a device to which the meta illuminators are applied and a simplified arrangement.

According to an aspect of an exemplary embodiment, meta illuminator includes: a first light emitter configured to emit pattern light; and a second light emitter configured to emit non-patterned light, wherein the first and second light emitters form a single body.

In the meta illuminator, the first and second light emitters may include meta-surfaces that are different from each other, and the meta-surfaces different from each other may be formed on a single material layer.

The first light emitter may include a pattern region that transmits a portion of incident light, and the second light emitter may not include the pattern region.

The first and second light emitters respectively may include a light source, a transparent substrate, and a meta material layer that are sequentially stacked in the single body.

The meta illuminator may further include a single layer mask disposed between the light source and the transparent substrate.

The light source may be a light source emitting light in a direction perpendicular to the transparent substrate, and may include a first light source included in the first light emitter and a second light source included in the second light emitter.

The light source may be a light source emitting light in a direction parallel to the transparent substrate, and may include a first light source included in the first light emitter and a second light source included in the second light emitter.

The meta material layer may include a first meta-surface included in the first light emitter and a second meta-surface included in the second light emitter, wherein the first and second meta-surfaces have light emission characteristics different from each other and each of the first and second meta-surfaces includes a plurality of nano-posts.

The mask may include a pattern region in the first light emitter and a through-hole in the second light emitter. The pattern region is configured to generate structured pattern light and may include a meta-surface.

The meta illuminator may further include an element for changing a travelling direction of light emitted from the light source. As an example, the element may be a mirror or a prism.

The first meta-surface may be provided to emit structured pattern light. The first meta-surface may be a meta-diffractive optical element (DOE).

The second metal surface may be a micro-meta lens array arranged to emit uniform illumination.

According to another exemplary embodiment, the second meta-surface may be a DOE provided to emit uniform illumination.

The first and second light sources may be vertical cavity surface emitting lasers (VCSELs).

The first and second light sources may be edge emitting laser diodes.

According to an aspect of an exemplary embodiment, there is provided a meta illuminator including: a first light source and a second light source; a transparent substrate including: a upper surface on which a first meta-surface and a second-meta surface are disposed; and a lower surface on which a patterned mask is disposed and which faces the first light source and the second light source; wherein the meta illuminator comprises a first region and a second region which are separately provided and disposed side-by-side, and wherein the first light source, the transparent substrate, the first meta-surface, and the patterned mask are disposed in the first region so that a first light emitted from the first light source passes the patterned mask, the transparent substrate, and the first meta-surface, and wherein the second light source, the transparent substrate, the second meta-surface are disposed in the second region so that a second light emitted from the second light source passes the transparent substrate and the second meta-surface without passing through the patterned mask disposed in the first region.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
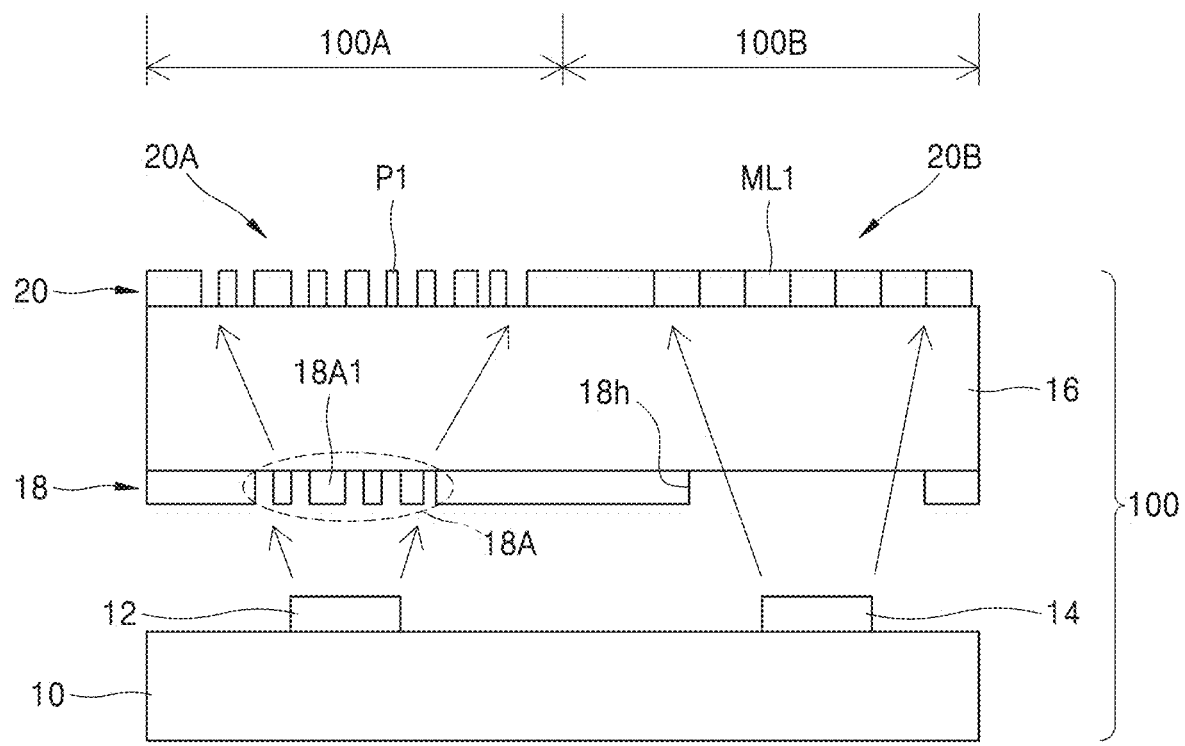
FIG. 1 is a cross-sectional view of a first meta illuminator according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

It will be understood that, although the terms "first", "second", etc. may be used herein to describe various elements, the elements should not be limited by these terms. These terms are only used to distinguish one element from another element.

As used herein, the singular forms are intended to include the plural forms as well, unless the context clearly indicates otherwise. Also, it should be understood that, when a part "comprises" or "includes" a constituent element in the specification, unless otherwise defined, it is not excluding other elements but may further include other elements.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

FIG. 1 shows a composite illuminator 100 (hereinafter, referred to as the first meta illuminator) using a meta-surface according to an exemplary embodiment.

Referring to FIG. 1, the first meta illuminator 100 may include a light source supporter 10, a substrate 16, first and second light sources 12 and 14, a mask 18, and a meta-material layer 20. The light source supporter 10 and the substrate 16 are sequentially stacked. The light source supporter 10 and the substrate 16 are separated from each other. The first and second light sources 12 and 14 are disposed on a surface, for example, an upper surface of the light source supporter 10. The first and second light sources 12 and 14 are spaced apart by a given distance. The first and second light sources 12 and 14 may be the same or different light sources from each other. The first and second light sources 12 and 14 may be light sources that emit laser light. The first and second light sources 12 and 14 may be light sources that emit light towards the substrate 16 in direction perpendicular to the upper surface of the light source supporter 10. The first and second light sources 12 and 14 may be, for example, a vertical cavity surface emitting laser (VCSEL). Light may be directly irradiated to the substrate 16 by the first and second light sources 12 and 14. The first and second light sources 12 and 14 may be, for example, light sources that emit light in an infrared region, but may not be limited thereto. The substrate 16 may be a transparent substrate with respect to light. The substrate 16 may be, for example, a silicon substrate. The meta material layer 20 is formed on an upper surface of the substrate 16. Here, the meta material layer 20 may denote a material layer including a plurality of nano-posts that constitute a meta-surface. The meta material layer 20 may include nano-gratings, nano-holes, or nano-slits instead of the nano-posts. Also, the meta-material layer 20 may include at least one of the nano-posts, the nano-gratings, the nano-holes, and the nano-slits or may include a combination of two or more of the nano-posts, the nano-gratings, the nano-holes, and the nano-slits. The meta material layer 20 may include a first meta-surface 20A and a second meta-surface 20B. The first meta-surface 20A may correspond to the first light source 12 and may be disposed above the first light source 12. The second meta-surface 20B may correspond to the second light source 14 and may be disposed above the second light source 14. The first meta-surface 20A may be a meta lens that projects a structured pattern light generated by a pattern region 18A of the mask 18 to a given location. Accordingly, dimensions (width and height) of each of the first nano-posts P1 that constitute the first meta-surface 20A and an arrangement of the first nano-posts P1 may be designed in consideration of functions of the first meta-surface 20A. Heights and pitches of the first nano-posts P1 may be the same and a width and a diameter of each of the first nano-posts P1 may be different, but such conditions are not limited thereto. Each of the first nano-posts P1 may have a size less than a wavelength of incident light. Light transmission characteristics, for example, a phase and/or intensity of each of the first nano-posts P1 with respect to incident light may be controlled through controlling of the size and type of each of the first nano-posts P1. Accordingly, the light transmission characteristics of each of the first nano-posts P1 may be designed according to locations of the first nano-posts P1. Accordingly, a wave front of incident light may be transformed to an arbitrary shape by appropriately arranging the first nano-posts P1. As an example, a lens that focuses or diffuses incident light may be realized by using a meta-surface.

The second meta-surface 20B may be configured to provide light for a two-dimensional (2D) image or a three-dimensional (3D) image. The second meta-surface 20B may diffuse light incident to the second meta-surface 20B to have a uniform intensity. Light of uniform intensity may be irradiated by the second meta-surface 20B to an entire area of a target illumination region. In other words, the second meta-surface 20B may be configured to obtain illumination with uniform intensity of light on the entire area of the target illumination region to be irradiated. The second meta-surface 20B may include a plurality of micro-meta lenses ML1. Each of the micro-meta lenses ML1 may have a size in a range of about a few μm to about a few hundreds of μm.

Figure 5:
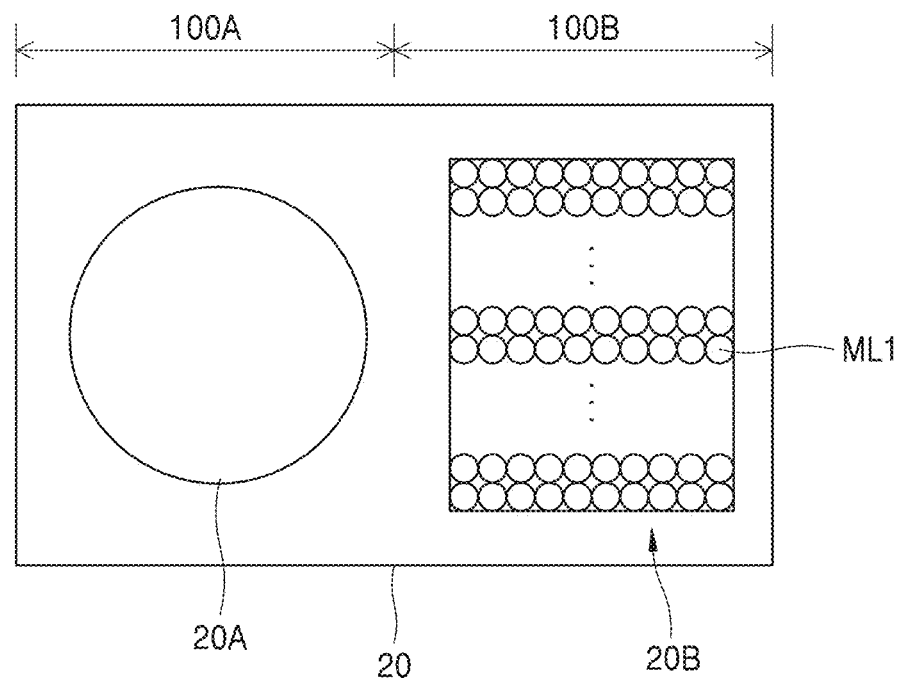
FIG. 5 is a plan view of a meta material layer of the first meta illuminator of FIG. 1.

The micro meta lenses ML1 may have the same shape and size. The plurality of micro-meta lenses (ML1) may be arranged in a given shape. As an example, as depicted in FIG. 5, the plurality of micro meta lenses ML1 may form an array (hereinafter, a micro-meta lens array) in which the micro meta lenses ML1 are arranged in a horizontal direction and a vertical direction.

Each of the micro meta lenses ML1 that form the second meta-surface 20B may perform a function of diverging incident light. Since the plurality of micro meta lenses ML1 are the same, in a view of the whole second meta-surface 20B, light of a uniform intensity may be emitted from the second meta-surface 20B.

Each of the plurality of micro meta lenses ML1 that constitute the second meta-surface 20B may be referred to as a unit micro meta lens constituting the micro meta lens array. The unit micro meta lens, like the first meta-surface 20A, may include a plurality of nano-posts, and the dimension of each of the nano-posts and arrangement of the nano-posts may be designed considering the functions of the unit micro meta lens. In the micro meta lens array that constitutes the second meta-surface 20B, the unit micro meta lenses may have the same size and the same function, and thus, a height of the plurality of nano-posts included in the unit micro meta lenses may be the same, and also, pitches or intervals thereof may be the same.

The dimensions (e.g., height, interval, width, etc.) of the first nano-posts P1 of the first meta-surface 20A and the dimensions of the nano-posts included in the micro meta lenses ML1 that constitute the second meta-surface 20B may be controlled in a manufacturing process depending on required functions of the first and second meta-surfaces 20A and 20B. That is, the light transmission characteristics or light transfer characteristics of the first nano-posts P1 and the nano-posts included in the micro meta lenses ML1 may be controlled in a manufacturing process. Thus, if necessary, the first and second meta-surfaces 20A and 20B may be designed to other optical elements (e.g., diffractive optical element, etc.).

The first nano-posts P1 and the nano-posts included in the micro meta lenses ML1 may have a refractive index greater than that of a surrounding material by 1 or greater. For example, if the substrate 16 has a refractive index of 2, a material included in the first nano-posts P1 and the nano-posts included in the micro meta lenses ML1 may have a refractive index of 3 or more.

The mask 18 is disposed between the first and second light sources 12 and 14. According to an exemplary embodiment, the mask 18 may be attached to a lower surface of the substrate 16. The mask 18 may be directly contact the lower surface of the substrate 16. In some other exemplary embodiments, another transparent member may be disposed between the mask 18 and the substrate 16. The mask 18 may be a metal mask. The mask 18 may include a pattern region 18A and a through-hole 18h. The pattern region 18A corresponds to the first light source 12 and the first meta-surface 20A. The through-hole 18h corresponds to the second light source 14 and the second meta-surface 20B. The pattern region 18A may be a region where a plurality of patterns 18A1 are formed and separated from each other in the through-hole 18h. The plurality of patterns 18A1 of the pattern region 18A may be metal patterns. Accordingly, light incident to the plurality of patterns 18A1 of light incident to the pattern region 18A is reflected, and light incident between the patterns 18A1 enters the substrate 16, and then, enters the first meta-surface 20A. Thus, a structured pattern light is generated by the pattern region 18A. Accordingly, the plurality of patterns 18A1 may be designed so that the structured pattern light is generated.

The plurality of patterns 18A1 of the pattern region 18A may have the same height. Also, intervals between the plurality of patterns 18A1 may be equal to each other. However, a width of each of the plurality of patterns 18A1 may be different from each other. These conditions are not limited thereto, and may be changed depending on the function of the mask 18. The through-hole 18h may have a diameter that is greater than the size of the second light source 14. The through-hole 18h may be arranged so as not to interrupt light emitted from the second light source 14 to enter an entire region of the second meta-surface 20B. That is, the through-hole 18h may have a size so that light emitted from the second light source 14 is prevented from being incident to the first meta-surface 20A while allowing the light emitted from the second light source 14 to be incident to the entire region of the second meta-surface 20B.

As an example, the pattern region 18A of the mask 18 may be a meta-surface including a plurality of nano-posts. In this case, the arrangement of the plurality of nano-posts and each of the plurality of nano-posts may be designed to generate the structured pattern light. As an example, when the pattern region 18A is a meta-surface, heights, widths, pitches, etc. of the plurality of nano-posts of the meta-surface may be determined to generate the structured pattern light in a manufacturing process.

In another example, the entire mask 18 may be a meta-surface. At this point, the pattern region 18A of the mask 18 may be designed to generate the structured pattern light, and the remaining part may be designed to reflect incident light.

The first meta illuminator 100 may be divided into a first part 100A configured to generate a structured pattern light and a second part 100B configured to irradiate light of uniform intensity to the entire region to be irradiated. That is, the first meta illuminator 100 may include the first part 100A configured to emit a structured pattern light and a second part 100B configured to irradiate light of uniform intensity to the entire region to be irradiated. The pattern region 18A may exist on the substrate 16 so that the light emitted from the second light source 14 reaches the substrate 16 without passing through the pattern region 18A. The division of the first meta illuminator 100 may be applied to second through fourth meta illuminators which will be described below.

According to the descriptions above, the first part 100A of the first meta illuminator 100 may be a part including the first light source 12, the pattern region 18A of the mask 18, the substrate 16, and the first meta-surface 20A. The second part 100B may be a part including the second light source 14, the through-hole 18h of the mask 18, the substrate 16, and the second meta-surface 20B. Illuminations generated from the first part 100A and the second part 100B are different from each other, and thus, the first meta illuminator 100 may be referred to as a composite illuminator, and for the same reason, the second through fourth illuminators which will be described below may also be referred to as composite illuminators.

Meanwhile, the first meta illuminator 100 may include a driving unit for driving the first and second light sources 12 and 14. The first and second light sources 12 and 14 may be operated in a time-sharing method by the driving unit. Also, the first and second light sources 12 and 14 may be simultaneously operated.

Figure 2:
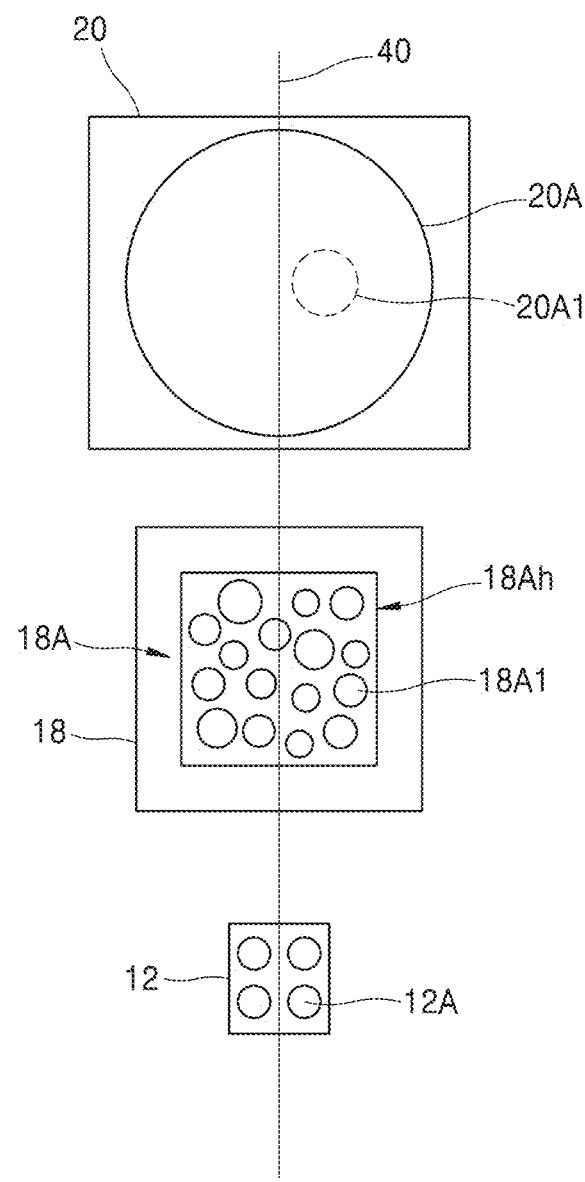
FIG. 2 shows plan views of a first light source, a pattern region of a mask, and a first meta-surface that are included in a first part of a first meta illuminator of FIG. 1.

FIG. 2 shows plan views of the first light source 12, the pattern region 18A of the mask 18, and the first meta-surface 20A included in the first part 100A of the first meta illuminator 100 of FIG. 1.

In FIG. 2, reference numeral 40 denotes an optical axis.

Referring to FIG. 2, the first light source 12 may include a plurality of unit light sources 12A that constitute an array. In FIG. 2, it is depicted that the first light source 12 includes the four unit light sources 12A for convenience. However, an array of the unit light sources 12A may be formed by including more than four unit light sources 12A to supply sufficient light to the first meta-surface 20A. Each of the unit light source 12A may be a VCSEL. It is seen that the pattern region 18A of the mask 18 includes a hole 18Ah passing through the mask 18 and a plurality of patterns 18A1 distributed in the hole 18Ah. Each of the patterns 18A1 may be a nano-post. Widths of the patterns 18A1 may differ from each other or may be the same. The patterns 18A1 may be arranged to form a symmetrical shape or an asymmetrical shape. Also, the patterns 18A1 may be formed as repeated patterns. Also, the patterns 18A1 may be randomly distributed. That is, the patterns 18A1 may be distributed in an arbitrary form, and each of the patterns 18A1 may have an arbitrary shape. The hole 18Ah of the pattern region 18A is rectangular shape, but may be a circular shape or other shapes. The first meta-surface 20A has an appearance of a circular shape, but is not limited thereto, that is, may have a rectangular shape or other shapes. The first meta-surface 20A may have an area or a diameter that sufficiently accommodates all light incident through the pattern region 18A of the mask 18.

Figure 3:
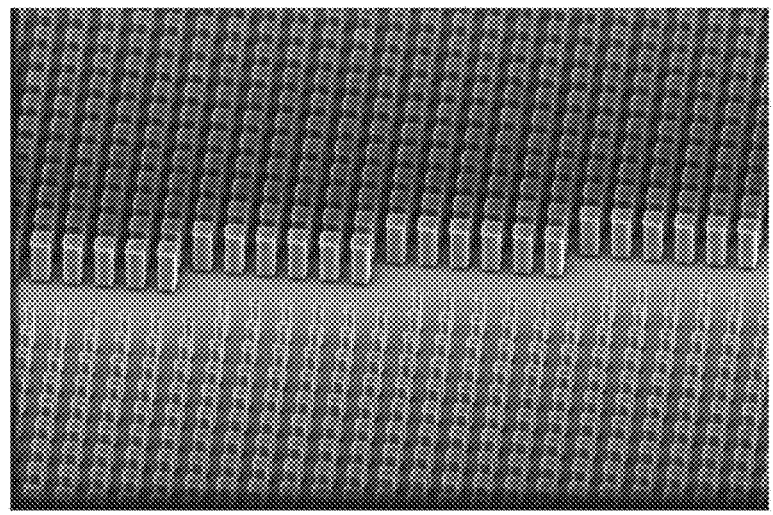
FIG. 3 is a 3D image of a nano-post array included in a first region of the first meta-surface of FIG. 2.

FIG. 3 is a 3D image of a nano-post array included in a first region 20A1 of the first meta-surface 20A of FIG. 2. An arbitrary nano-post in the nano-post array of FIG. 3 may correspond to the first nano-posts P1 of the first meta-surface 20A of FIG. 1.

Figure 4:
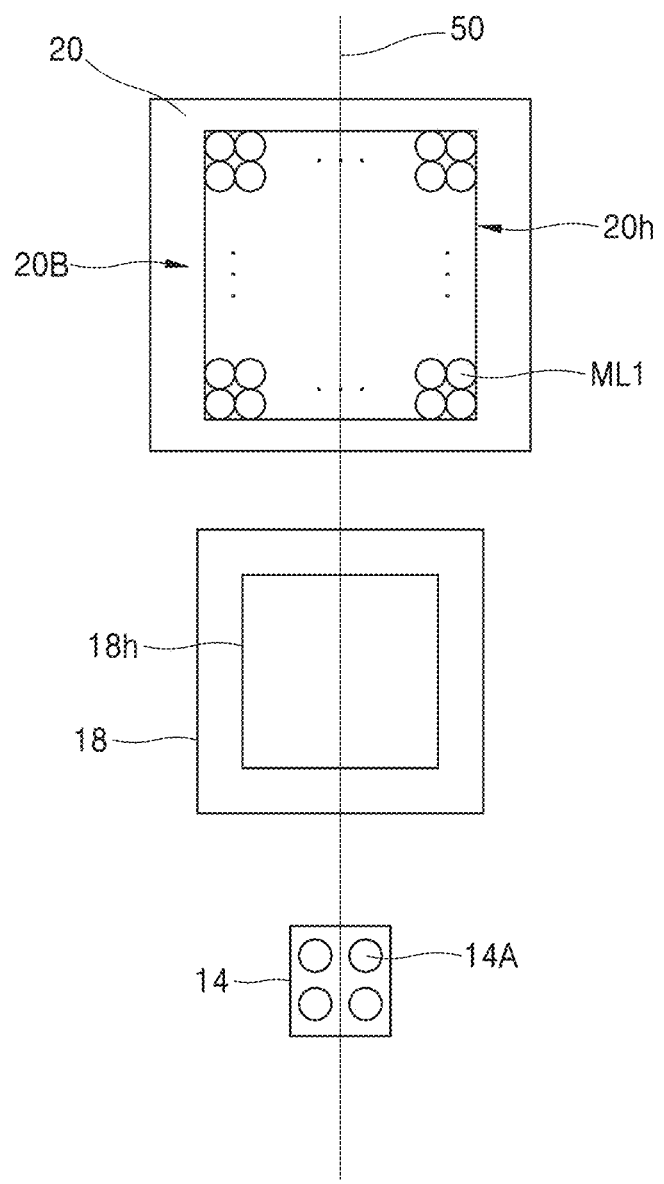
FIG. 4 is shows plan views of a second light source, a through-hole of a mask, and a second meta-surface that are included in a second part of a first meta illuminator of FIG. 1.

FIG. 4 is a plan view of the second light source 14, the through-hole 18h of the mask 18, and the second meta-surface 20B included in the second part 100B of the first meta illuminator 100 of FIG. 1.

In FIG. 4, reference numeral 50 denotes an optical axis.

Referring to FIG. 4, the second light source 14 may include a plurality of unit light sources 14A that constitute an array. In FIG. 4, it is depicted that the second light source 14 includes four unit light sources 14A for convenience, but the second light source 14 may form an array by including more than four unit light sources 14A to supply sufficient light to the second meta-surface 20B. An area and diameter of the through-hole 18h formed in the mask 18 may be greater than the second light source 14. There is no pattern that may interfere with the travel of light in the through-hole 18h. Accordingly, light emitted from the second light source 14 is directly incident to the substrate 16, and thus, may incident to the second meta-surface 20B. The second meta-surface 20B may include the plurality of micro meta lenses ML1 disposed in a through-hole 20h formed in the meta material layer 20. The micro meta lenses ML1 may form an array. Each of the micro meta lenses ML1 may have a circular shape, but is not limited thereto, that is, may have a rectangular shape or other shapes.

FIG. 5 is a plan view of the meta material layer 20 of the first meta illuminator 100 of FIG. 1.

Referring to FIG. 5, as described with reference to FIG. 2, an appearance of the first meta-surface 20A has a circular shape. For convenience of explanation, the plurality of nano-posts that constitute the first meta-surface 20A are not depicted. An overall appearance of the second meta-surface 20B is a rectangular shape, but is not limited thereto, and may have a circular shape. The first meta-surface 20A and the second meta-surface 20B are separated from each other.

Figure 6:
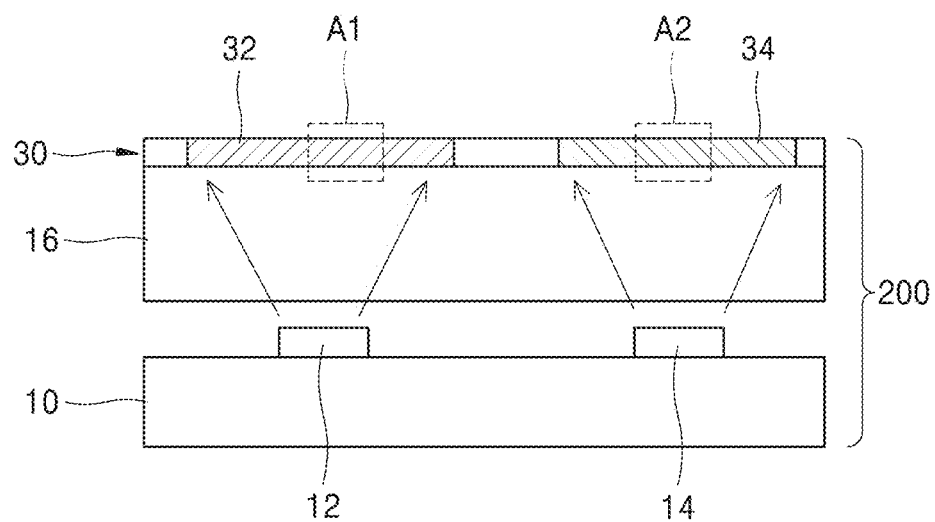
FIG. 6 is a cross-sectional view of a second meta illuminator according to an exemplary embodiment.

FIG. 6 is a cross-sectional view of a composite illuminator 200 (hereinafter, a second meta illuminator) that uses a meta-surface according to an exemplary embodiment. Parts different from the first meta illuminator 100 will be described.

Referring to FIG. 6, the second meta illuminator 200 may include the first and second light sources 12 and 14, the transparent substrate 16, and a meta material layer 30. The first and second light sources 12 and 14 are mounted on a supporter 10. Lights emitted from the first and second light sources 12 and 14 are directly incident to the transparent substrate 16. That is, there is no other member between the transparent substrate 16 and the first and second light sources 12 and 14. The meta material layer 30 is disposed on an upper surface of the transparent substrate 16. The meta material layer 30 may directly contact the upper surface of the transparent substrate 16. The meta material layer 30 may include a first meta-surface 32 and a second meta-surface 34. The first meta-surface 32 corresponds to the first light source 12. The second meta-surface 34 corresponds to the second light source 14. The first and second meta-surfaces 32 and 34 are separated from each other in the meta material layer 30. The first meta-surface 32 and the second meta-surface 34 may include a plurality of nano-posts. The first meta-surface 32 and the second meta-surface 34 may function as a diffractive optical element (DOE). Arrangements and shapes of each of the plurality of nano-posts included in the first meta-surface 32 may be designed to form a structured pattern light by diffracting incident light. The plurality of nano-posts included in the second meta-surface 34 may be designed so that light having uniform intensity is irradiated to an entire region to be irradiated by diffracting incident light. Accordingly, the first meta-surface 32 and the second meta-surface 34 may function as meta DOEs.

Figure 7:
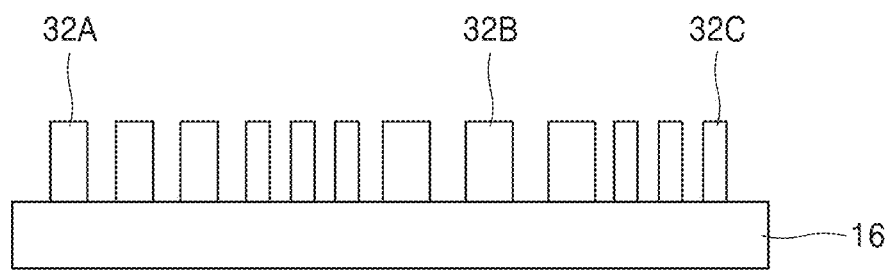
FIG. 7 is a magnified cross-sectional view of a first region of a first meta-surface in the second meta illuminator of FIG. 6.

FIG. 7 is a magnified cross-sectional view of a first region A1 of the first meta-surface 32 of the second meta illuminator 200 of FIG. 6.

Referring to FIG. 7, the first region A1 may include first, second, and third nano-posts 32A, 32B, and 32C on the substrate 16. The first through third nano-posts 32A through 32C may have the same height, but may have widths different from each other. The shapes and arrangements of the first through third nano-posts 32A through 32C of FIG. 7 are arbitrary. The arrangements and configurations of the plurality of nano-posts of the first meta-surface 32 may be differently designed depending on a shape of a structured pattern light.

Figure 8:
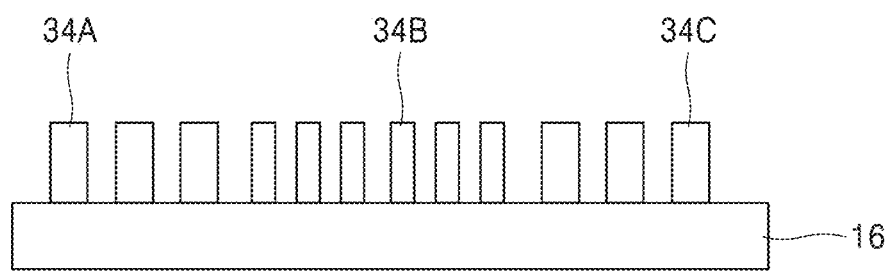
FIG. 8 is a magnified cross-sectional view of a second region of a second meta-surface in the second meta illuminator of FIG. 6.

FIG. 8 is a magnified cross-sectional view of a second region A2 of the second meta-surface 34 in the second meta illuminator 200 of FIG. 6.

Referring to FIG. 8, first, second, and third nano-posts 34A, 34B, and 34C are formed on the substrate 16. The first through third nano-posts 34A through 34C may have the same height. The first through third nano-posts 34A through 34C may have widths different from each other. The arrangements and shapes of the first through third nano-posts 34A through 34C on the substrate 16 are arbitrary. The arrangements and configurations of the plurality of nano-posts that constitute the second meta-surface 34 may be different depending on a required flood illumination.

Figure 9:
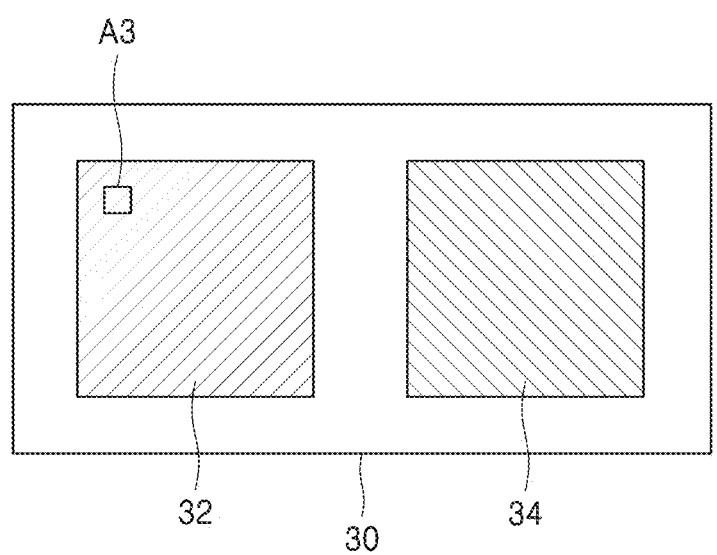
FIG. 9 is a plan view of a meta material layer of the second meta illuminator of FIG. 6.

FIG. 9 is a plan view of the meta material layer 30 of the second meta illuminator 200 of FIG. 6.

Referring to FIG. 9, the meta material layer 30 may include the first and second meta-surfaces 32 and 34 spaced apart from each other. The first and second meta-surfaces 32 and 34 are a rectangular shape, but is not limited thereto. For example, in the case of the first meta-surface 32, an appearance thereof may be a circular shape.

Figure 10:
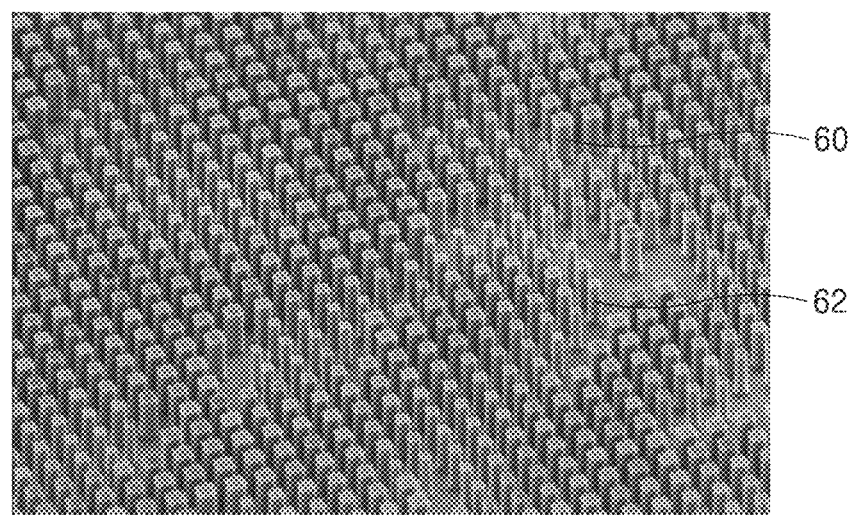
FIG. 10 is a 3D image of a plurality of nano-post array actually formed in a third region of a first meta region of FIG. 9.

FIG. 10 is a 3D image of a plurality of nano-post arrays actually formed in a third region A3 of the first meta region 32 of FIG. 9.

Referring to FIG. 10, a first nano-post 60 in the plurality of nano-post arrays may correspond to one of the first through third nano-posts 32A through 32C formed on the first meta-surface 32 of FIG. 7, and a second nano-post 62 may correspond to another one of the first through third nano-posts 32A through 32C formed on the first meta-surface 32 of FIG. 7.

Figure 11:
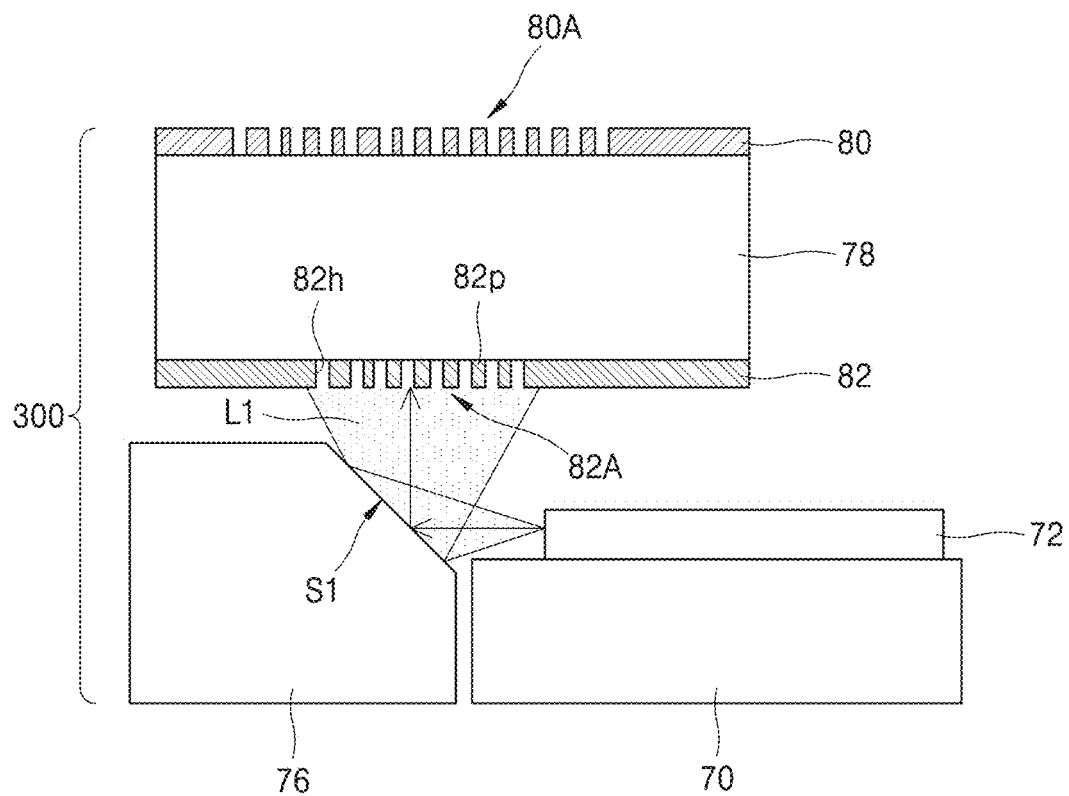
FIG. 11 is a side-view of a third meta illuminator according to an exemplary embodiment.

FIG. 11 shows a composite illuminator 300 (hereinafter, a third meta illuminator) using a meta-surface according to an exemplary embodiment.

Referring to FIG. 11, the third meta illuminator 300 does not employ a direct light irradiation method in which light L1 emitted from a light source 72 is directly irradiated to a substrate 78. third meta illuminator 300 employs an indirect light irradiation method in which light L1 emitted from the light source 72 is reflected by a light reflector 76, and afterwards, enters the substrate 78. In the third meta illuminator 300, the light source 72 emits the light L1 in a direction parallel to the substrate 78, that is, in a horizontal direction. The light source 72 may be an edge emitting laser diode or may include an edge emitting laser diode. Since this type of light source 72 is used, a thickness of the third meta illuminator 300 may be relatively thin. The light source 72 is mounted on a light supporter 70. A sub-supporter may be arranged on the light supporter 70 and the light source 72 may be mounted on the sub-supporter. The light reflector 76 may be disposed in front of a light emitting surface of the light source 72. Accordingly, the light L1 emitted from the light source 72 may firstly be incident to the light reflector 76. The light reflector 76 is an example member of changing a travelling direction of the light L1. However, the light reflector 76 of FIG. 11 is not limited thereto. As an example, as depicted in FIG. 11, the light reflector 76 may function as a mirror that reflects incident light to a direction different from an incident direction. As another example, the light reflector 76 may be replaced by a refractive member that refracts the incident light to different directions. For example, the light reflector 76 may be replaced by a prism.

Figure 12:
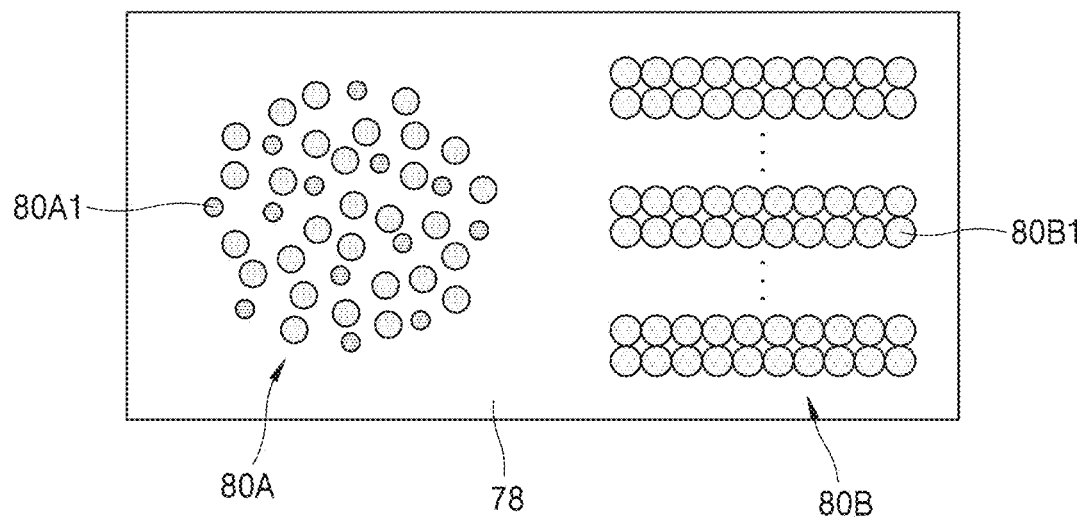
FIG. 12 is a plan view showing a case that only a plurality of nano-posts that constitute a meta-surface are on an upper surface of a substrate in the meta illuminator of FIG. 11.

Referring to FIG. 11, the light reflector 76 includes a mirror surface S1. The mirror surface S1 may be an inclined surface with a given inclination angle (e.g., 45°) with respect to a bottom surface of the light reflector 76. Since the mirror surface S1 has a given inclination angle, the light L1 incident to the mirror surface S1 from the light source 72 is reflected by the mirror surface S1, and thus, may enter the substrate 78 in a direction perpendicular to the bottom surface of the substrate 78. The mirror surface S1 may be disposed on a front face of a light emission surface of the light source 72 or a part from which the light L1 is emitted. The substrate 78 is disposed above the light reflector 76 and the light source 72. The substrate 78 is disposed to cover the light reflector 76 and the light source 72 with the mirror surface S1 of the light reflector 76 as the center. Since the light source 72 is mounted on the light supporter 70, at least a part of the light supporter 70 may be covered by the substrate 78. The substrate 78 may be disposed parallel to the light source 72. A material layer 80 is formed on an upper surface of the substrate 78. The material layer 80 may include a first meta-surface 80A. The first meta-surface 80A may function as a meta lens. A plan view of the material layer 80 may be the same as the plan view of the material layer 20 of FIG. 5. An arrangement of patterns of the first meta-surface 80A may be the same as the arrangement of the patterns that constitute the first meta-surface 20A of FIG. 5. The material layer 80 may include a second meta-surface that is the same as the second meta-surface 20B of FIG. 5. That is, in the third meta illuminator 300, the material layer 80 including a meta-surface may include the same material and the meta-surface configuration of the material layer 20 of FIG. 5. As another example, parts of the material layer 80 that surrounds the meta-surface may be removed. That is, only the first meta-surface 80A may remain on the upper surface of the substrate 78. In this case, only the first meta-surface 80A corresponding to the first meta-surface 20A of FIG. 5 and another meta-surface corresponding to the second meta-surface 20B may remain on the upper surface of the substrate 78. For example, as depicted in FIG. 12, only first nano-posts 80A1 that constitute the first meta-surface 80A and a plurality of micro meta lenses 80B1 that constitute the second meta-surface 80B may remain on the upper surface of the substrate 78.

Referring to FIG. 11, a mask 82 is disposed on a bottom surface of the substrate 78. The mask 82 may directly or indirectly contact the bottom surface of the substrate 78. The mask 82 may be a metal mask. The mask 82 is separated from the light source 72 and the light reflector 76. In FIG. 11, only a side of the mask 82 is shown, but the entire configuration of the mask 82 may be the same as the mask 18 described with reference to the first meta illuminator 100. That is, the mask 82 includes a pattern region 82A on a region corresponding to the first meta-surface 80A. The pattern region 82A may include a plurality of patterns 82p formed in a through-hole 82h of the mask 82. The plurality of patterns 82p are separated from each other and each may be a metal post. When the light L1 enters the pattern regions 82A, the light L1 incident to the plurality of patterns 82p is reflected, and the light L1 incident between the plurality of patterns 82p enters the substrate 78, and then, enters the first meta-surface 80A which is a meta lens arranged on the upper surface of the substrate 78, through the substrate 78. The plurality of patterns 82p in the pattern region 82A may be designed to generate a structured pattern light. The structured pattern light generated in the pattern region 82A may be projected to a front of the upper surface of the substrate 78 by the first meta-surface 80A.

The mask 82 may be replaced by a meta-surface like the mask 18 of the first meta illuminator 100.

Figure 13:
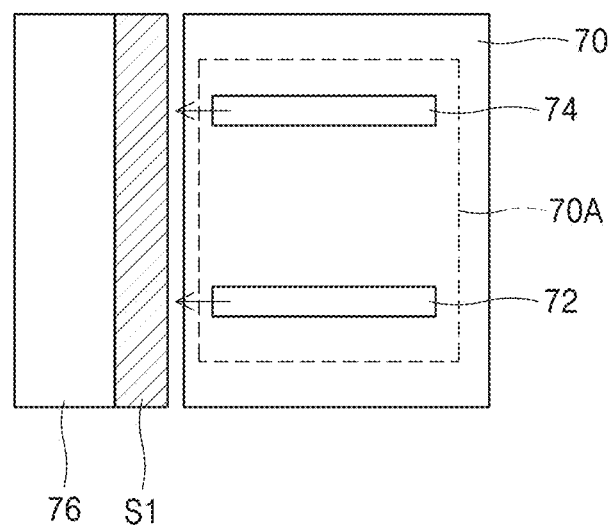
FIG. 13 is a plan view showing a light reflector and a light source supporter in a third meta illuminator of FIG. 11.

FIG. 13 is a plan view of the light reflector 76 and the light supporter 70 in the third meta illuminator 300 of FIG. 11.

Referring to FIG. 13, first and second light sources 72 and 74 are disposed parallel to each other on the light supporter 70. The first and second light sources 72 and 74 are separated from each other. The first light source 72 may be used to form a structured pattern light by irradiating light to the first meta-surface 80A. The second light source 74 may be used to form uniform illumination for a 2D/3D image by irradiating light to the second meta-surface 80B. The light reflector 76 is disposed in front of light-emitting surfaces of the first and second light sources 72 and 74. In FIG. 13, arrows directed towards the light reflector 76 indicate laser beam emitted from the first and second light sources 72 and 74. A mirror surface S1 of the light reflector 76 faces the first and second light sources 72 and 74. The mirror surface S1 may have a given length in a direction perpendicular to the first and second light sources 72 and 74. The mirror surface S1 is disposed parallel to the light supporter 70 along the light supporter 70 from one end to the other end of the light supporter 70. Accordingly, even though lights are simultaneously emitted from the first and second light sources 72 and 74, the lights emitted from the first and second light sources 72 and 74 may be reflected towards the first and second meta-surfaces 80A and 80B by the light reflector 76. In FIG. 13, the light reflector 76 may be replaced by a light refracting element. The light refracting element may be disposed to transmit incident light to the first and second meta-surfaces 80A and 80B by a refraction function of the light refracting element. The light refracting element may be, for example, a prism.

Figure 14:
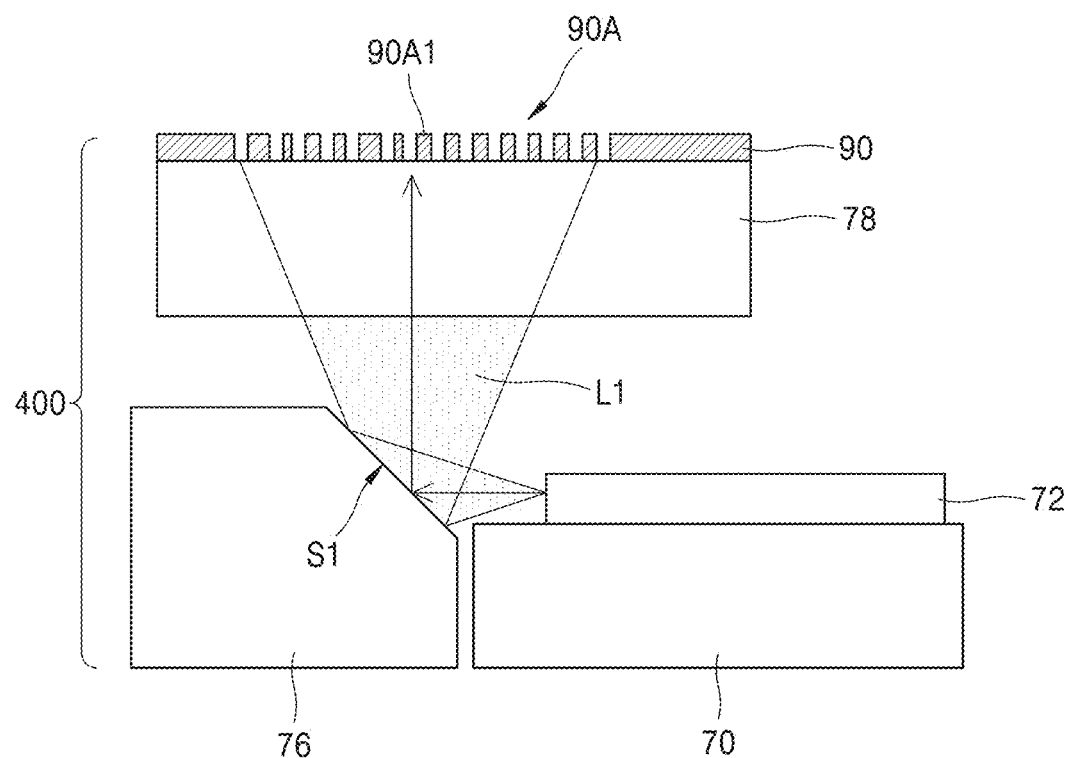
FIG. 14 is a side-view of a fourth meta illuminator according to an exemplary embodiment.

FIG. 14 is a side-view of a composite illuminator 400 (hereinafter, a fourth meta illuminator 400) using a meta-surface according to an exemplary embodiment. Parts of the fourth meta illuminator 400 different from the third meta illuminator 300 will be described.

Referring to FIG. 14, a meta material layer 90 is formed on the upper surface of the substrate 78. The meta material layer 90 may directly contact the upper surface of the substrate 78. The meta material layer 90 may include a first meta-surface 90A. The first meta-surface 90A includes a plurality of nano-posts 90A1. The plurality of nano-posts 90A1 may be arranged or designed so that the first meta-surface 90A functions as a DOE (hereinafter, a first meta DOE). Heights of the plurality of nano-posts 90A1 may be generally the same. Also, pitches between the plurality of nano-posts 90A1 may be the same or generally the same. However, widths of the plurality of nano-posts 90A1 may be different from each other. A planar configuration of the meta material layer 90 may be the same as that of the meta material layer 30 of FIG. 9. That is, the meta material layer 90 may include the first meta-surface 90A and another meta-surface corresponding to the second meta-surface 34 of FIG. 9. The other meta-surface may also include a plurality of nano-posts like the first meta-surface 90A. The plurality of nano-posts included in the other meta-surface may be disposed or designed to perform a function of a DOE (hereinafter, a second meta DOE). Light emitted from the first light source 72 may be generated as a structured pattern light by the first meta DOE. By the second meta DOE light emitted from the second light source 74 may be irradiated with uniform intensity on the entire region where the light is irradiated. The meta illuminators according to the exemplary embodiments described above are composite illuminators. However, they may be referred to as monolithic illuminators in that the illuminators that generate illumination having different characteristics from each other from a single unit layer.

In the case of an existing mobile phone, two or more illuminations may be needed. For example, three illuminations (e.g., a proximity sensor, a 2D and 3D illumination for face recognition) may be provided on a front part of the mobile phone, and these three illuminators may be individually mounted on the mobile phone. Accordingly, in the case of the existing mobile phone, three independent mounting spaces may be needed for the three illuminators. The current trend of the existing mobile phone is that a display area on a front side of the mobile phone is increased. However, in the case of an existing mobile phone, since a plurality of illuminators or illumination parts are individually used, it is difficult to reduce an area occupied by the entire illumination device at the front part of the mobile phone. Moreover, in the case of an existing mobile phone, as the number of the required illuminators is increased, an area occupied by all the illuminators is increased at the front part of the mobile phone. As a result, in the case of an existing mobile phone, a form-factor is increased and individual illuminators should be mounted one by one, and thus, this may be a cause of increasing manufacturing costs and the alignment in the manufacturing process may be complicated compared to the case of mounting a single illuminator.

However, in the case of the illuminators according to the exemplary embodiments, each of the illuminators is a composite illuminator based on a laser diode and using a meta-surface, and different illuminations are emitted from a single illuminator. Accordingly, when the meta illuminators according to the exemplary embodiments are used, since only one illuminator is mounted, most of the limitations of an existing mobile phone may be removed.

Meta illuminators or the concept of the meta illuminators according to the embodiments may be applied to not only a mobile phone, such as a smart phone, but also may be applied to various devices, for example, an illumination unit of a small portable device, such as watches, telescopes, or microscopes (glasses), etc. and also a structured light (SL) illumination projector for a depth sensor, or a compact laser light scanner.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A meta illuminator comprising:
a first light emitter configured to emit a patterned light, the first light emitter comprising a first light source; and
a second light emitter configured to emit a non-patterned light, the second light emitter comprising a second light source,
wherein the first and second light emitters are in a line disposed in a lateral direction, and
wherein the first and the second light emitters respectively further comprise a transparent substrate and a meta material layer that are sequentially stacked.

2. The meta illuminator of claim 1, wherein the first light emitter comprises a pattern region that transmits a portion of incident light, and the second light emitter does not comprise the pattern region.

3. The meta illuminator of claim 1, further comprising a single layer mask disposed between the first and second light sources and the transparent substrate.

4. The meta illuminator of claim 3, wherein the single layer mask comprises a pattern region included in the first light emitter and a through-hole included in the second light emitter.

5. The meta illuminator of claim 4, wherein the pattern region comprises a meta-surface as a region for generating a structured pattern light.

6. The meta illuminator of claim 3, further comprising an element configured to change a travelling direction of light respectively emitted from the first light source and the second light source.

7. The meta illuminator of claim 6, wherein the element comprises a mirror or a prism.

8. The meta illuminator of claim 1, wherein the first light source and the second light source are respectively configured to emit light in a direction perpendicular to the transparent substrate.

9. The meta illuminator of claim 8, wherein the first and the second light sources comprise vertical cavity surface emitting lasers (VCSELs).

10. The meta illuminator of claim 1, wherein the first light source and the second light source are respectively configured to emit light in a direction parallel to the transparent substrate.

11. The meta illuminator of claim 10, wherein the first and the second light sources comprise edge emitting laser diodes.

12. The meta illuminator of claim 10, further comprising an element configured to change a travelling direction of light respectively emitted from the first light source and the second light source.

13. The meta illuminator of claim 1, wherein the meta material layer comprises:
    a first meta-surface included in the first light emitter; and
    a second meta-surface included in the second light emitter,
    wherein the first and the second meta-surfaces have light emission characteristics that are different from each other and each of the first and the second meta-surfaces comprises a plurality of nano-posts.

14. The meta illuminator of claim 13, wherein the first meta-surface is a meta lens provided to emit the patterned light.

15. The meta illuminator of claim 13, wherein the first meta-surface is a meta diffractive optical element (DOE) provided to emit the patterned light.

16. The meta illuminator of claim 13, wherein the second metal-surface is a micro-meta lens array provided to emit the non-patterned light having uniform illumination.

17. The meta illuminator of claim 13, wherein the second meta-surface is a meta diffractive optical element (DOE) provided to emit the non-patterned light having uniform illumination.

18. A meta illuminator comprising:
    a first light emitter configured to emit a patterned light; and
    a second light emitter configured to emit a non-patterned light,
    wherein the first and second light emitters form a single body and the first and second light emitters are in a line disposed in a lateral direction,
    wherein the first and the second light emitters respectively comprise meta-surfaces that are different from each other, and formed on a single material layer.

19. A meta illuminator comprising:
    a first light source and a second light source;
    a transparent substrate comprising:
        a upper surface on which a first meta-surface and a second-meta surface are disposed; and
        a lower surface on which a patterned mask is disposed and which faces the first light source and the second light source;
    wherein the meta illuminator comprises a first region and a second region which are separately provided and disposed side-by-side,
    wherein the first light source, the transparent substrate, the first meta-surface, and the patterned mask are disposed in the first region so that a first light emitted from the first light source passes the patterned mask, the transparent substrate, and the first meta-surface, and
    wherein the second light source, the transparent substrate, the second meta-surface are disposed in the second region so that a second light emitted from the second light source passes the transparent substrate and the second meta-surface without passing through the patterned mask disposed in the first region.

* * * * *